United States Patent
Leobandung

(10) Patent No.: US 10,461,194 B2
(45) Date of Patent: Oct. 29, 2019

(54) THRESHOLD VOLTAGE CONTROL USING CHANNEL DIGITAL ETCH

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/934,130

(22) Filed: Mar. 23, 2018

(65) Prior Publication Data

US 2019/0296151 A1    Sep. 26, 2019

(51) Int. Cl.
| | | |
|---|---|---|
| *H01L 29/786* | (2006.01) | |
| *H01L 29/06* | (2006.01) | |
| *H01L 29/775* | (2006.01) | |
| *H01L 29/66* | (2006.01) | |

(52) U.S. Cl.
CPC .... *H01L 29/78609* (2013.01); *H01L 29/0669* (2013.01); *H01L 29/66439* (2013.01); *H01L 29/775* (2013.01)

(58) Field of Classification Search
CPC .......... H01L 29/78609; H01L 29/0669; H01L 29/775; H01L 29/66439
See application file for complete search history.

(56) References Cited

U.S. PATENT DOCUMENTS

| | | |
|---|---|---|
| 8,994,081 B2 | 3/2015 | Leobandung |
| 9,257,539 B2 | 2/2016 | Rooyackers et al. |
| 9,391,200 B2 | 7/2016 | Liu et al. |
| 9,536,984 B2 | 1/2017 | Azize et al. |
| 9,548,358 B2 | 1/2017 | Leobandung |
| 9,825,183 B2 | 11/2017 | Lee et al. |
| 10,141,403 B1 * | 11/2018 | Cheng ................. H01L 29/0665 |
| 2016/0315167 A1 | 10/2016 | Nakamura et al. |
| 2017/0040321 A1 | 2/2017 | Mitard |

FOREIGN PATENT DOCUMENTS

WO    2008/008204 A1    1/2008

OTHER PUBLICATIONS

Wang et al., "Digital Etch Technique for Forming Ultra-Scaled Germanium-Tin )Ge1-xSnx) Fin Structure," Scientific Reports. vol. 7, Article No. 1835. May 12, 2017. pp. 1-9.

* cited by examiner

*Primary Examiner* — Sonya D. McCall-Shepard
(74) *Attorney, Agent, or Firm* — Tutunjian & Bitetto, P.C.; Vazken Alexanian

(57) ABSTRACT

A method is presented for fine-tuning a threshold voltage of a nanosheet structure. The method includes forming a nanosheet stack over a substrate including a plurality of sacrificial layers and a plurality of nanowires, forming a sacrificial gate structure over the nanosheet stack, and partially etching one or more sacrificial layers to form cavities, the partial etching resulting in remaining sections of sacrificial layers. The method includes removing the sacrificial gate structure, removing at least one of the remaining sections of sacrificial layers to expose a surface of each of the plurality of nanowires, forming an oxidation channel on the exposed surface on only either a top side or bottom side of each of the plurality of nanowires, removing the oxidation channels to form a recess on each of the plurality of nanowires, and depositing a high-k metal gate extending into the recess of each of the plurality of nanowires.

16 Claims, 10 Drawing Sheets

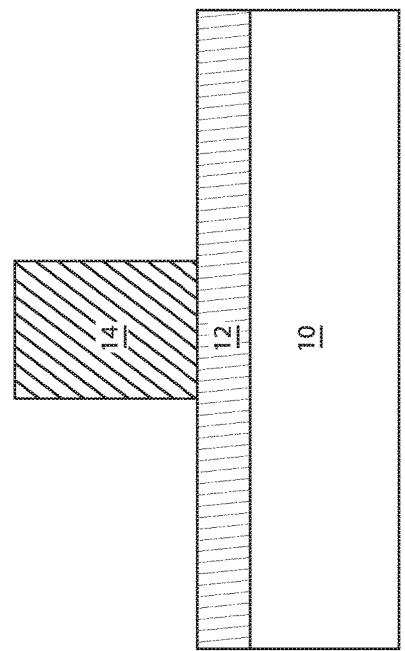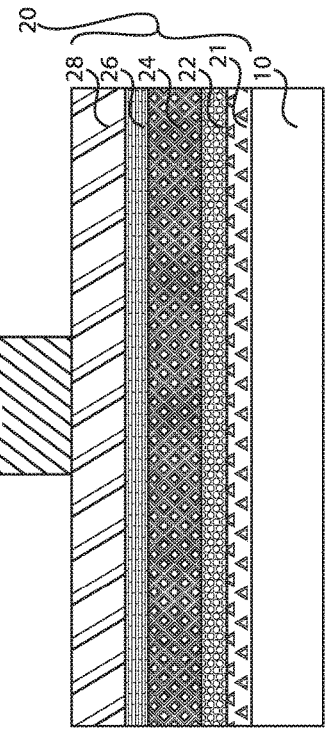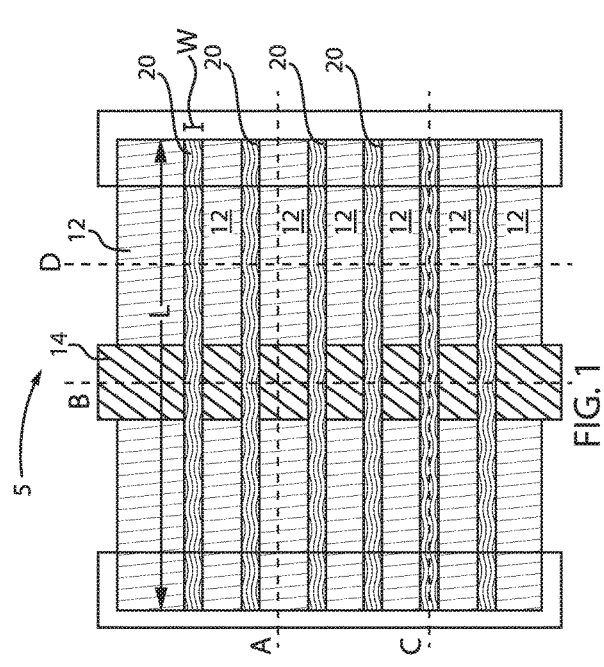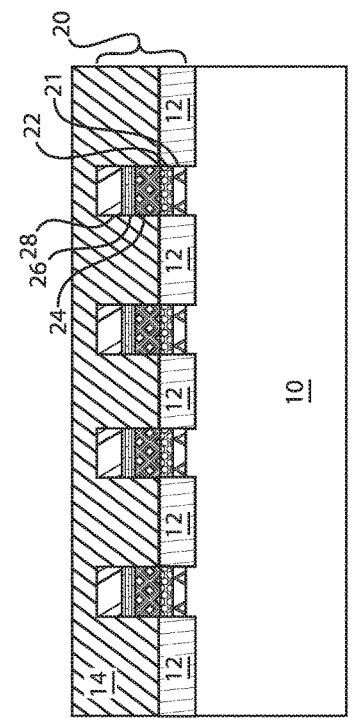
FIG. 1
FIG. 2
FIG. 3
FIG. 4

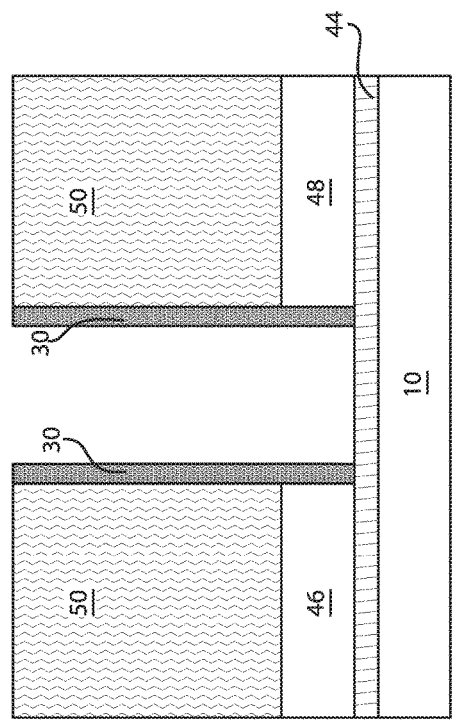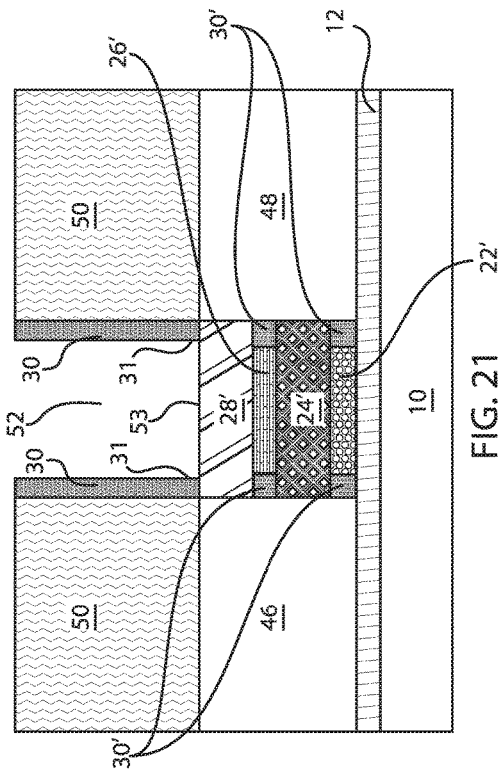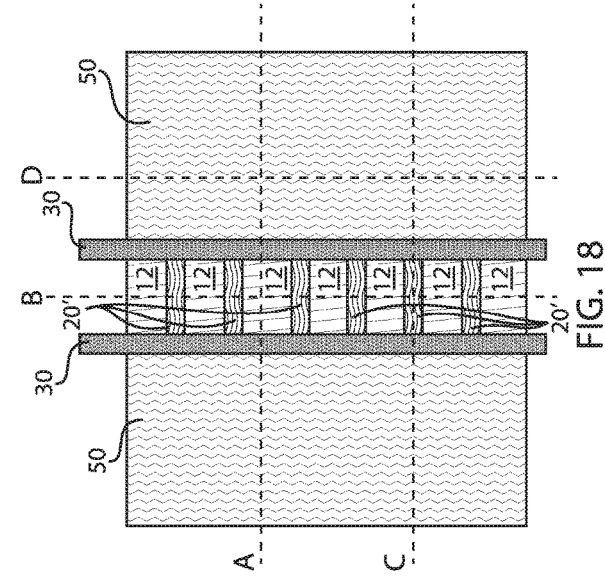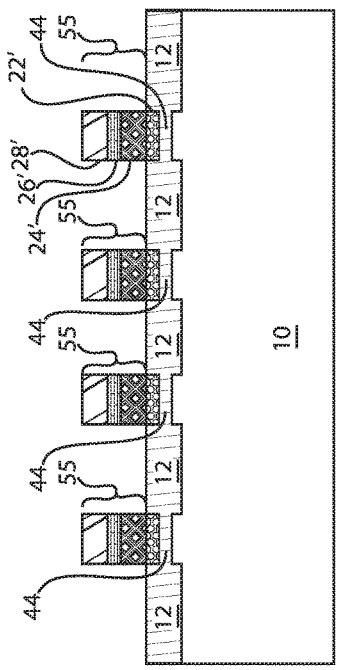

THRESHOLD VOLTAGE CONTROL USING CHANNEL DIGITAL ETCH

BACKGROUND

Technical Field

The present invention relates generally to semiconductor devices, and more specifically, to controlling threshold voltage by employing a one-sided channel digital etch.

Description of the Related Art

The use of non-planar semiconductor devices such as, for example, fin field-effect-transistors (FinFETs), tri-gate and semiconductor nanowire FETs is the next step in the evolution of complementary metal oxide semiconductor (CMOS) devices. A semiconductor nanowire with a partially or a totally surrounding gate is one architecture for off-current reduction in sub-45 nm technologies. A gate-all semiconductor nanowire configuration enables channel film thickness requirements to be relaxed for target leakage control. Stacked semiconductor nanowires yield high current levels per layout surface area, thus overcoming limits imposed by a small width-to-pitch ratio.

SUMMARY

In accordance with an embodiment, a method is provided for fine-tuning a threshold voltage of a nanosheet structure. The method includes forming a nanosheet stack over a substrate including a plurality of sacrificial layers and a plurality of nanowires, forming a sacrificial gate structure over the nanosheet stack, forming first spacers adjacent the sacrificial gate structure, partially etching one or more of the plurality of sacrificial layers to form cavities, the partial etching resulting in remaining sections of sacrificial layers, and filling the cavities with second spacers. The method further includes digitally etching one side or both sides of the nanosheet structure, forming source/drain regions adjacent the nanosheet stack, forming an inter-layer dielectric (ILD) over the source/drain regions, removing the sacrificial gate structure, and removing at least one of the remaining sections of sacrificial layers to form gaps between the plurality of nanowires. The method also includes forming oxidation channels on each of the plurality of nanowires, removing at least another of the remaining sections of sacrificial layers along with the oxidation channels formed on each of the plurality of nanowires, and depositing a high-k metal gate (HKMG) between the first spacers and within the gaps formed between the plurality of nanowires.

In accordance with another embodiment, a method is provided for fine-tuning a threshold voltage of a nanosheet structure. The method includes forming a nanosheet stack over a substrate including a plurality of sacrificial layers and a plurality of nanowires, forming a sacrificial gate structure over the nanosheet stack, partially etching one or more of the plurality of sacrificial layers to form cavities, the partial etching resulting in remaining sections of sacrificial layers, digitally etching one side or both sides of the nanosheet structure, removing the sacrificial gate structure, removing at least one of the remaining sections of sacrificial layers to expose a surface of each of the plurality of nanowires, forming an oxidation channel on the exposed surface of each of the plurality of nanowires, removing the oxidation channels to form a recess on each of the plurality of nanowires, and depositing a high-k metal gate (HKMG) extending into the recess of each of the plurality of nanowires.

In accordance with another embodiment, a semiconductor structure is provided for fine-tuning a threshold voltage of a nanosheet structure. The semiconductor structure includes a nanosheet stack including a plurality of nanosheet wires formed over a substrate, each of the plurality of nanosheet wires having at least one recessed surface and a high-k metal gate (HKMG) formed over the nanosheet stack and between the plurality of nanosheet wires such that the HKMG extends into each of the recessed surfaces of each of the plurality of nanowires.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a top-down view of the semiconductor structure in FIG. 2 where a sacrificial gate structure is formed over a substrate, in accordance with an embodiment of the present invention;

FIG. 2 is a vertical cross-sectional view through line A-A shown in FIG. 1, in accordance with an embodiment of the present invention;

FIG. 3 is a vertical cross-sectional view through line B-B shown in FIG. 1, in accordance with an embodiment of the present invention;

FIG. 4 is a vertical cross-sectional view through line C-C shown in FIG. 1, in accordance with an embodiment of the present invention;

FIG. 18 is a top-down view of the semiconductor structure in FIG. 19 where the sacrificial gate structure is removed and an inter-layer dielectric (ILD) is deposited over the source/drain regions, in accordance with an embodiment of the present invention;

FIG. 19 is a vertical cross-sectional view through line A-A shown in FIG. 18, in accordance with an embodiment of the present invention;

FIG. 20 is a vertical cross-sectional view through line B-B shown in FIG. 18, in accordance with an embodiment of the present invention;

FIG. 21 is a vertical cross-sectional view through line C-C shown in FIG. 18, in accordance with an embodiment of the present invention;

Throughout the drawings, same or similar reference numerals represent the same or similar elements.

DETAILED DESCRIPTION

Figure 6:
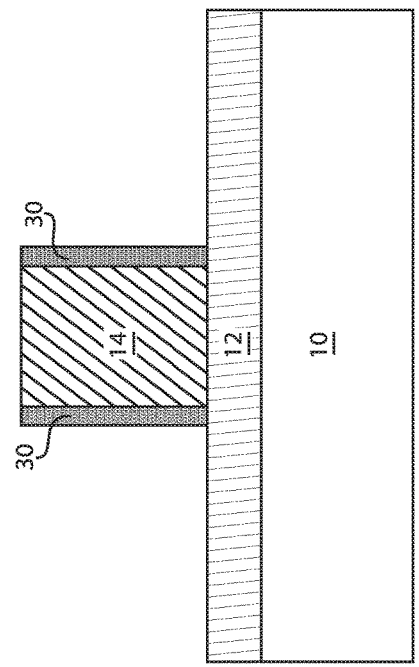
FIG. 6 is a vertical cross-sectional view through line A-A shown in FIG. 5, in accordance with an embodiment of the present invention.

Embodiments in accordance with the present invention provide methods and devices for controlling or fine-tuning a threshold voltage by etching only one side of a nanosheet structure or fin field-effect-transistor (FinFET). With technology scaling, the metal oxide semiconductor field effect transistor (MOSFET's) channel length is reduced. As the channel length approaches source-body and drain-body depletion widths, charge in the channel due to these parasitic diodes become comparable to the depletion charge due to the MOSFET gate-body voltage, thus rendering the gate and body terminals to be less effective. The finite depletion width of the parasitic diodes do not influence the energy barrier height to be overcome for inversion formation in a long channel device. However, as the channel length becomes shorter, both channel length and drain voltage reduce this barrier height. This results in the barrier height to be modulated by the channel length variation, thus resulting in threshold voltage variation. Threshold voltage variation affects leakage power, delay, and operation of high-performance MOSFETs.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity.

This is not intended to be interpreted as a limitation of any particular embodiment, or illustration, or scope of the claims.

FIG. 1 is a top-down view of the semiconductor structure in FIG. 2 where a sacrificial gate structure is formed over a substrate, in accordance with an embodiment of the present invention.

The top-down view 5 is a view depicting gate structure 14 formed over shallow trench isolation (STI) regions 12. The top-down view also depicts nanosheet stacks 20 extending perpendicular to the gate structure 14. The nanosheet stacks 20 have a width "W" and a length "L." Additionally, line A-A extends horizontally through the gate structure 14, line B-B extends vertically through the gate structure 14, line C-C extends horizontally through the nanosheet stack 20, and line D-D is parallel to the gate structure 14 and extends vertically through the nanosheet stacks 20 without intersecting the gate structure 14.

FIG. 2 is a vertical cross-sectional view through line A-A shown in FIG. 1, in accordance with an embodiment of the present invention.

A semiconductor structure includes a dielectric isolation layer 12 formed over a substrate 10. A sacrificial gate structure 14 is formed over the dielectric isolation layer 12.

The semiconductor substrate 10 that is employed in the present application can include any semiconductor material. Illustrative examples of semiconductor materials that can be used for the semiconductor substrate 10 include, but are not limited to, Si, SiGe alloys, SiGeC, SiC, Ge alloy, GaSb, GaP, GaN, GaAs, InAs, INP, AN and all other III-V or II-VI compound semiconductors. In one embodiment, the semiconductor substrate 10 can include a multilayered stack of such semiconductor materials. In some embodiments, the semiconductor substrate 10 can include a bulk semiconductor substrate. By "bulk" it is meant the entirety of the semiconductor substrate 10 from one surface to an opposite surface is composed of a semiconductor material. In other embodiments, the semiconductor substrate 10 can include a semiconductor-on-insulator (SOI) substrate including a handle substrate, a buried insulator layer and a top semiconductor material layer.

The dielectric isolation layer 12 can include a dielectric material such as silicon oxide, silicon nitride, or a dielectric metal oxide. In one embodiment, the dielectric isolation layer 12 can include silicon oxide. The dielectric isolation layer 12 can be formed, for example, by deposition of a dielectric material layer at least up to a height of the nanosheet stack 20 including a plurality of nanowires 24, 28 (FIGS. 3 and 4).

Figure 29:
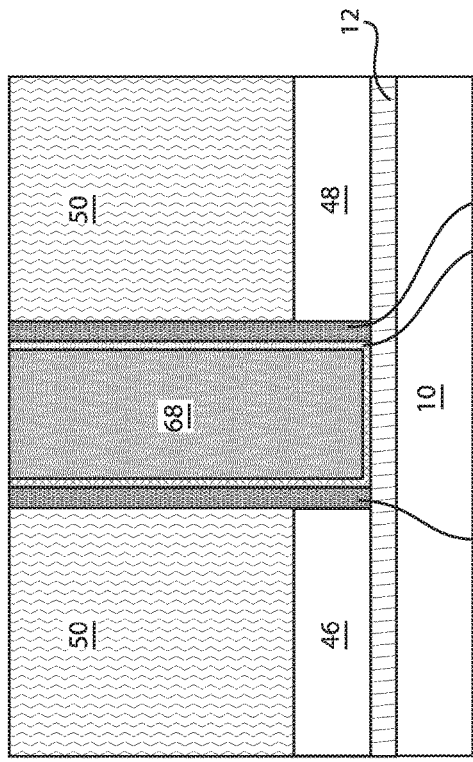
FIG. 29 is a vertical cross-sectional view through line A-A shown in FIG. 28, in accordance with an embodiment of the present invention.

The sacrificial gate structure 14 is a structure that is employed in the process sequence for forming the final device structure, but the sacrificial gate structure 14 is removed prior to finalizing the device structure. In some embodiments, the sacrificial gate structure 14 provides the geometry for a later formed functional gate structure 68 (FIG. 29). The functional gate structure 68, which remains in the structure of the final device controls device switching, i.e., the electrical state of a device, e.g., fin field effect transistor (FinFET), from "ON" to "OFF."

The sacrificial gate structure 14 can include a semiconductor material such as polysilicon or a silicon-containing semiconductor alloy such as a silicon-germanium alloy. The sacrificial gate structure 14 can be formed using chemical vapor deposition (CVD) or plasma enhanced chemical vapor deposition (PECVD). The sacrificial gate structure 14 can have a thickness from about 100 nm to about 500 nm, although lesser and greater thicknesses can also be employed.

FIG. 3 is a vertical cross-sectional view through line B-B shown in FIG. 1, in accordance with an embodiment of the present invention.

The semiconductor structure illustrates the nanosheet stacks 20 formed over the substrate 10. The nanosheet stacks 20 can include a plurality of layers. In one example, the nanosheet stacks 20 each include a first layer 21, a second layer, 22, a third layer 24, a fourth layer 26, and a fifth layer 28. The layers 21, 22, 24, 26, 28 of each of the nanosheet stacks 20 are described with reference to FIG. 4. The nanosheet stacks 20 can also be referred to as vertical stacks 20.

FIG. 4 is a vertical cross-sectional view through line C-C shown in FIG. 1, in accordance with an embodiment of the present invention.

The vertical stacks 20 can be formed by depositing material layers on the top surface of the substrate 10 and patterning the material layers. The material layers can include, from bottom to top, a first silicon-germanium alloy layer 21, a second silicon-germanium alloy layer 22, a first nanowire 24, a third silicon-germanium alloy layer 26, and a second nanowire 28.

The silicon-germanium alloy layers 21, 22, 26 can include a single crystalline silicon-germanium alloy having an atomic concentration of germanium and epitaxially aligned to the single crystalline structure of the substrate 10. The atomic concentration of germanium can be in a range from 10% to 99%, although lesser and greater atomic concentrations can also be employed. The thickness and the atomic concentration of the silicon-germanium alloy layers 21, 22, 26 are selected such that the entirety of the silicon-germanium alloy layers 21, 22, 26 remain single crystalline without strain relaxation through generation of dislocation defects. The silicon-germanium alloy layers 21, 22, 26 can be formed by an epitaxial deposition process employing a silicon precursor and a germanium precursor.

In one example, the first SiGe alloy layer 21 has about 50% atomic concentration of Ge, the second SiGe alloy layer 22 has about 15% atomic concentration of Ge, and the third SiGe alloy layer 26 has about 25% atomic concentration of Ge. The first and second SiGe alloy layers 21, 22 are formed in direct contact to each other. The first and second SiGe alloy layers 21, 22 are formed between the substrate 10 and the first nanowire 24. The third SiGe alloy layer 26 can be formed in direct contact and in between the first and second nanowires 24, 28. In one example, the first and second nanowires 24, 28 can be silicon (Si) nanowires. The nanowire stack 20 can also be formed with other semiconductors, such as III-V materials consisting of InAs, GaAs, InP, InGaAs, InGaP, etc.

The first, second, and third SiGe alloy layers 21, 22, 26 can each have a thickness of about 15 nm, whereas the first and second nanowires 24, 28 can each have a thickness of about 20 nm.

As used herein, a "nanowire" refers to an elongated structure extending along a lengthwise direction and having lateral dimensions within a range from 1 nm to 100 nm. As used herein, a "lateral dimension" refers to the maximum extent of a structure within a plane that is perpendicular to the lengthwise direction of the structure.

Figure 5:
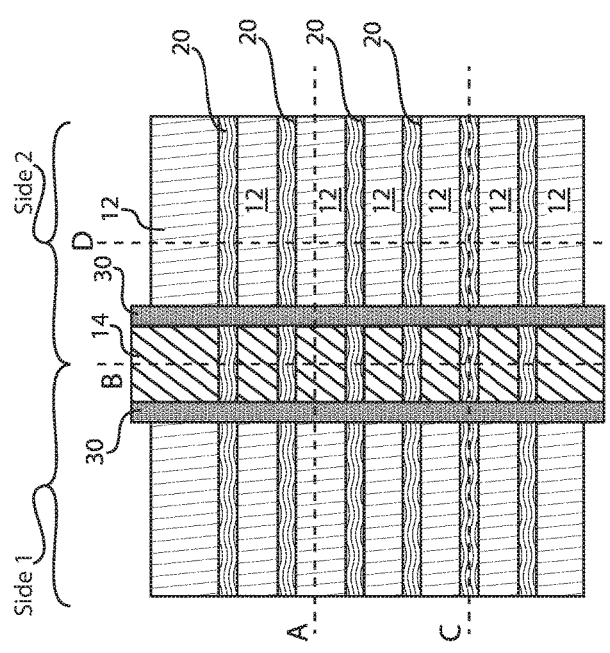
FIG. 5 is a top-down view of the semiconductor structure in FIG. 6 where spacers are formed adjacent the sacrificial gate structure, the semiconductor structure depicting a first side of the nanosheet structure (left) and a second side of the nanosheet structure (right), in accordance with an embodiment of the present invention.

FIG. 5 is a top-down view of the semiconductor structure in FIG. 6 where spacers are formed adjacent the sacrificial gate structure, the semiconductor structure depicting a first side of the nanosheet structure (left) and a second side of the nanosheet structure (right), in accordance with an embodiment of the present invention.

The top-down view depicts a first side of the nanosheet structure (left side; side 1) and a second side of the nanosheet structure (right side; side 2).

FIG. 6 is a vertical cross-sectional view through line A-A shown in FIG. 5, in accordance with an embodiment of the present invention.

In the vertical cross-sectional view through line A-A, spacers 30 are shown formed adjacent the gate structure 14. The spacers 30 can be formed by first providing a spacer material and then etching the spacer material. The spacer material can include any dielectric spacer material including, for example, a dielectric oxide, dielectric nitride, and/or dielectric oxynitride. In one example, the spacer material can include silicon oxide or silicon nitride. The spacer material can be provided by a deposition process including, for example, chemical vapor deposition (CVD), plasma enhanced chemical vapor deposition (PECVD), or physical vapor deposition (PVD). The etching of the spacer material can include a dry etch process such as, for example, a reactive ion etch (RIE).

Figure 7:
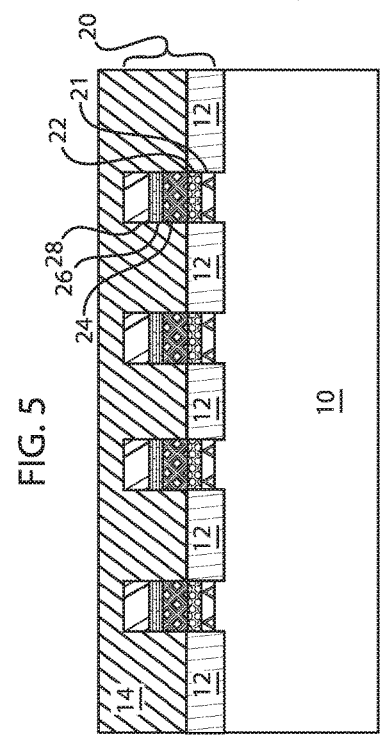
FIG. 7 is a vertical cross-sectional view through line B-B shown in FIG. 5, in accordance with an embodiment of the present invention.

FIG. 7 is a vertical cross-sectional view through line B-B shown in FIG. 5, in accordance with an embodiment of the present invention.

In the vertical cross-sectional view through line B-B, the spacers 30 are not shown.

Figure 8:
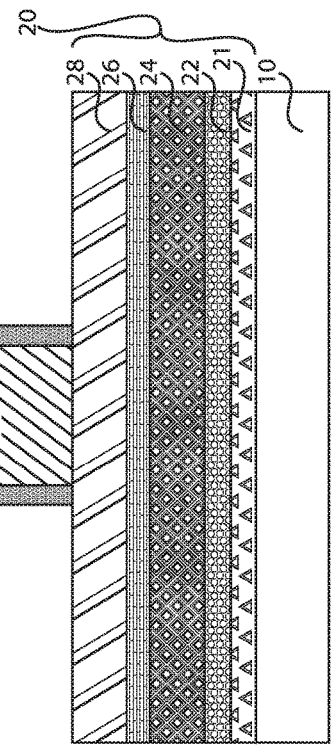
FIG. 8 is a vertical cross-sectional view through line C-C shown in FIG. 5, in accordance with an embodiment of the present invention.

FIG. 8 is a vertical cross-sectional view through line C-C shown in FIG. 5, in accordance with an embodiment of the present invention.

In the vertical cross-sectional view through line C-C, the spacers 30 are shown formed adjacent the gate structure 14. The spacers can have a width or thickness of about 2 nm to 5 nm.

Figure 9:
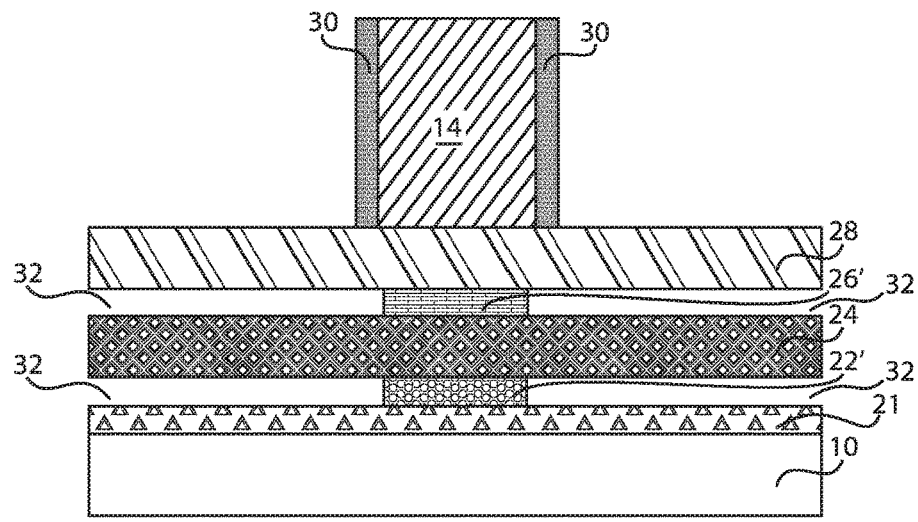
FIG. 9 is a vertical cross-sectional view through line C-C shown in FIG. 5 after one or more sacrificial layers are partially etched to form cavities within the nanosheet stack, in accordance with an embodiment of the present invention.

FIG. 9 is a vertical cross-sectional view through line C-C shown in FIG. 5 after one or more sacrificial layers are partially etched to form cavities within the nanosheet stack, in accordance with an embodiment of the present invention.

The second SiGe alloy layer 22 and the third SiGe alloy layer 26 are etched such that remaining portions 22', 26' remain. Thus, only the end segments of the second SiGe alloy layer 22 and the third SiGe alloy layer 26 are removed. Additionally, cavities 32 are formed adjacent the remaining portions 22', 26'.

The removal of end segments of the second SiGe alloy layer 22 and the third SiGe alloy layer 26 from each multilayered stacked semiconductor material structure 20 can be performed by etching selective to nanowires 24, 28. In one embodiment of the present application, the removal of end segments of the second SiGe alloy layer 22 and the third SiGe alloy layer 26 from each vertical stack 20 can be performed by etching in hydrochloric acid (HCl) vapor and at a temperature from about 400° C. to about 800° C. In another embodiment of the present application, the removal of end segments can be performed by wet etching using hydrogen peroxide ($H_2O_2$) or isotropic reactive ion etching (RIE).

The amount of end segments of the second SiGe alloy layer 22 and the third SiGe alloy layer 26 removed from each multilayered stacked semiconductor material structure 20 can vary depending on the conditions of the etch employed. In one embodiment, and by way of an example, from about 2 nm to about 5 nm portions of sacrificial semiconductor material can be removed.

Figure 10:
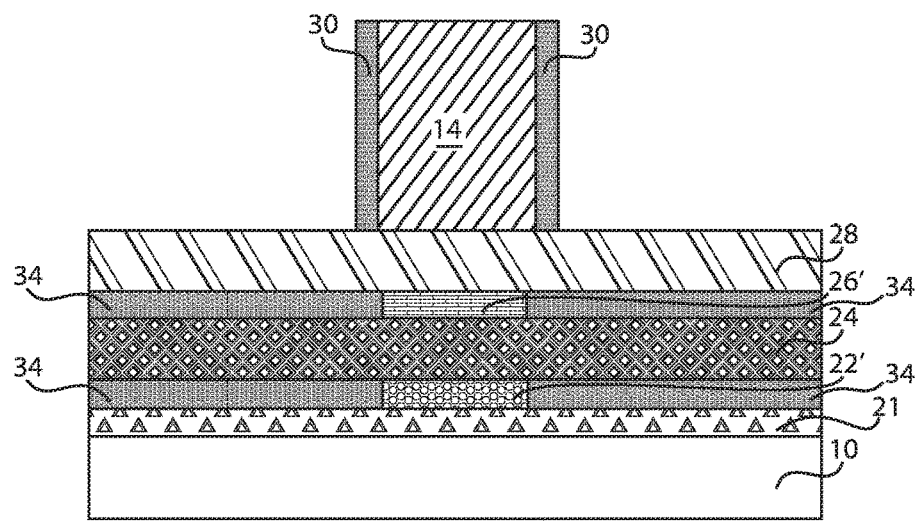
FIG. 10 is a vertical cross-sectional view through line C-C shown in FIG. 5 after the cavities within the nanosheet stack are filled with a dielectric nanowire material, in accordance with an embodiment of the present invention.

FIG. 10 is a vertical cross-sectional view through line C-C shown in FIG. 5 after the cavities within the nanosheet stack are filled with a dielectric nanowire material, in accordance with an embodiment of the present invention.

The dielectric nanowire material 34 can also be referred to as a second spacer. The second spacers 34 can have a width or thickness of about 5 nm. The second spacers 34 are formed within the area previously occupied by the second SiGe alloy layer 22 and the third SiGe alloy layer 26.

The second spacer material can include a same or different spacer material as the first spacer material (of spacers 30). In one example, the second spacer 34 or dielectric material can be silicon oxide, silicon nitride, silicon oxynitride, a dielectric metal oxide, or a combination thereof. The dielectric material can be deposited, for example, by CVD. The thickness of the deposited dielectric material can be selected such that the entire volume of the cavities 32 are filled with the dielectric material.

Figure 11:
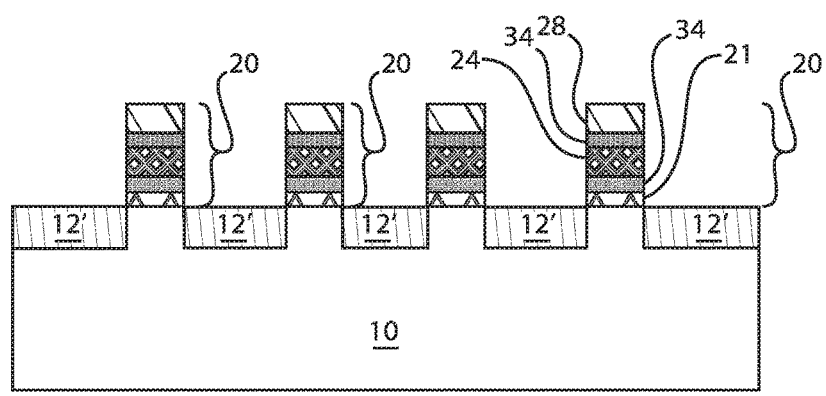
FIG. 11 is a vertical cross-sectional view through line D-D shown in FIG. 5 where spacers have been formed, in accordance with an embodiment of the present invention.

FIG. 11 is a vertical cross-sectional view through line D-D shown in FIG. 5 where spacers have been formed.

In various example embodiments, a digital etch technique can be employed on one side or both sides of the nanosheet structure. For example, the digital etch technique can be employed only on the second side (see FIG. 5) of the nanosheet structure.

Digital etching involves the removal of atomic layers of a compound semiconductor using surface limited reactions. A well-ordered, clean compound semiconductor can undergo reactions that will only remove the top layer of atoms. In the case of SiGe, a surface limited reaction would remove the top layer of Ge, until the surface is terminated by Si atoms. A different etching process would then be employed to remove the Si. The idea is to have atomic level control over the etching process and maintain a flat, ordered surface. A digital etching process would have advantages such as its application at room temperature, and its ability to create a well-ordered surface at each point in the etching process. Therefore, digital etch is a high-precision etch technique that can provide tight control of etch variability. For Si and Ge, atomic layer etch has been demonstrated using either chlorine (Cl) or fluorine (F) adsorption that is subsequently followed by the removal of the halides by argon (Ar) ion bombardment.

In FIG. 11, the digital etch results in etching the STI regions 12 to recessed STI regions 12'. A top surface of the recessed STI regions 12' are flush with (or coplanar with) a bottom surface of the nanosheet stacks 20.

Figure 12:
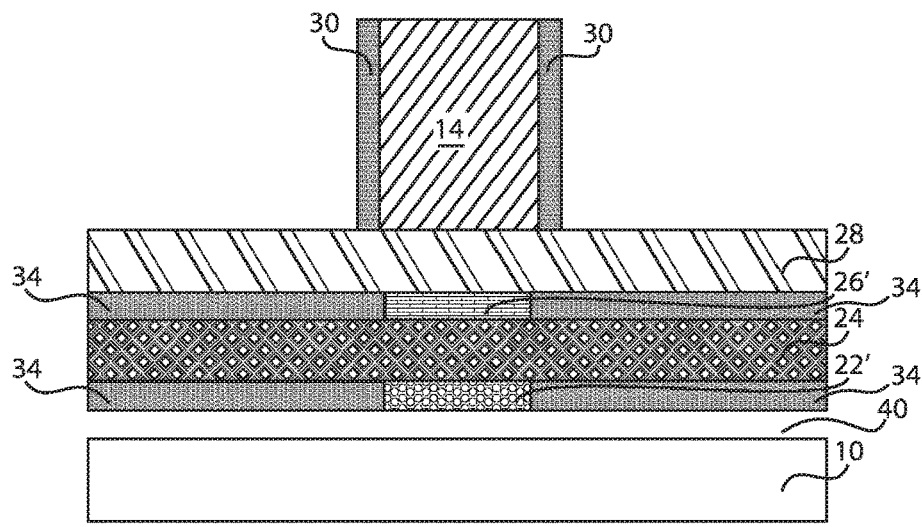
FIG. 12 is a vertical cross-sectional view through line C-C shown in FIG. 5 where another sacrificial layer is entirely removed by etching to form a gap region, in accordance with an embodiment of the present invention.

FIG. 12 is a vertical cross-sectional view through line C-C shown in FIG. 5 where another sacrificial layer is entirely removed by etching to form a gap region, in accordance with an embodiment of the present invention.

The first SiGe alloy layer 21 can be completely removed to form cavity or gap 40. The removal of the entirety of first SiGe alloy layer 21 from each multilayered stacked semiconductor material structure 20 can be performed utilizing an etch process. In one embodiment of the present application, an etch selective to non-removed second and third SiGe alloy layers 22', 26' and nanowires 24, 28 can be employed to remove the entirety of the first SiGe alloy layer 21 from each vertical stack 20. In one example, the selective etch can include an HCl vapor.

Figure 13:
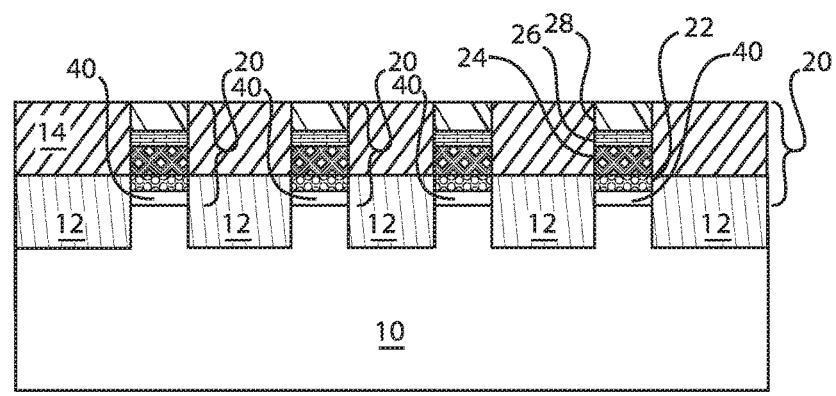
FIG. 13 is a vertical cross-sectional view through line B-B shown in FIG. 5 where the another sacrificial layer is entirely removed by etching on the first side only (left), in accordance with an embodiment of the present invention.

FIG. 13 is a vertical cross-sectional view through line B-B shown in FIG. 5 where the another sacrificial layer is entirely removed by etching on the first side only (left), in accordance with an embodiment of the present invention.

The removal of the first SiGe alloy layer 21 from each vertical stack 20 suspends each vertical stack 20 over an upper surface of the structure. Thus, and in some embodiments of the present application, the bottommost surface of each vertical stack 20 is now exposed (due to the cavities 40 formed). In another embodiment, the bottommost surface of each vertical stack 20 remains in direct contact with the substrate 10.

Figure 14:
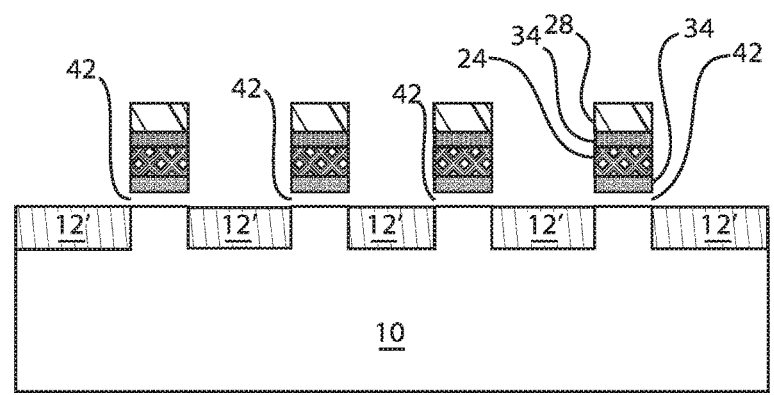
FIG. 14 is a vertical cross-sectional view through line D-D shown in FIG. 5 where a further digital etch takes place on only one side (right) of the nanosheet structure, in accordance with an embodiment of the present invention.

FIG. 14 is a vertical cross-sectional view through line D-D shown in FIG. 5 where a further digital etch takes place on only one side (right) or both sides of the nanosheet structure, in accordance with an embodiment of the present invention.

Regarding the digital etch process, the removal of the first SiGe alloy layer 21 results in each multilayered stacked semiconductor material structure 20 being suspended over an upper surface of the semiconductor structure 10 and over an upper surface of STI regions 12'. The gap region can be designated as 42.

Figure 15:
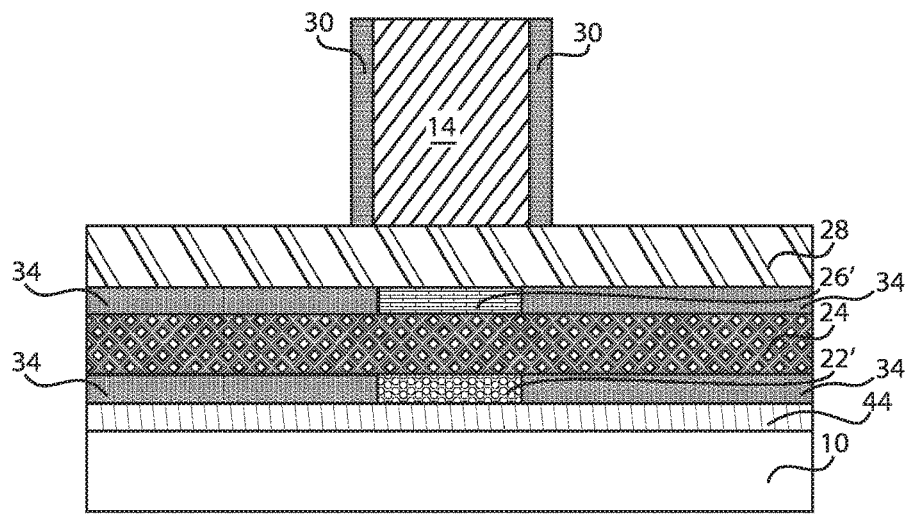
FIG. 15 is a vertical cross-sectional view through line C-C shown in FIG. 5 where the gap region is filled with a dielectric material, in accordance with an embodiment of the present invention.

FIG. 15 is a vertical cross-sectional view through line C-C shown in FIG. 5 where the gap region is filled with a dielectric material, in accordance with an embodiment of the present invention.

In various example embodiments, an oxide 44 can be formed within the cavity or gap 40. The planarized oxide 44 fills any gaps 40 that were created in the previous step in which the entirety of the first SiGe alloy layer 21 was removed from each vertical stack 20. The oxide 44 can be formed utilizing any deposition process including those mentioned above. The planarizing process can include chemical mechanical polishing (CMP) followed by an etch process.

Figure 16:
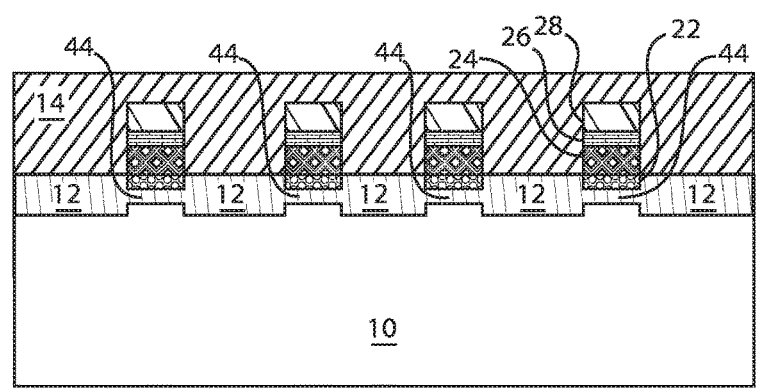
FIG. 16 is a vertical cross-sectional view through line B-B shown in FIG. 5 where the gap region is filled with the dielectric material on the first side only (left), in accordance with an embodiment of the present invention.

FIG. 16 is a vertical cross-sectional view through line B-B shown in FIG. 5 where the gap region is filled with the dielectric material on the first side only (left), in accordance with an embodiment of the present invention.

In one embodiment, the upper surface of the oxide 44 can be coplanar with the bottommost surface of the non-removed portion of sacrificial semiconductor material 22', 26' of each vertical stack 20.

Figure 17:
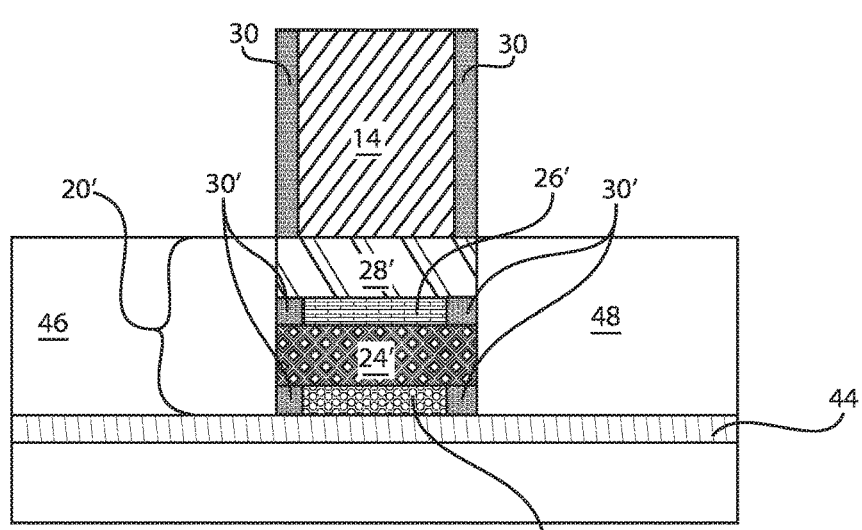
FIG. 17 is a vertical cross-sectional view through line C-C shown in FIG. 5 where source/drain regions are formed adjacent the nanosheet stack, in accordance with an embodiment of the present invention.

FIG. 17 is a vertical cross-sectional view through line C-C shown in FIG. 5 where source/drain regions are formed adjacent the nanosheet stack, in accordance with an embodiment of the present invention.

Source/drain regions 46, 48 can be formed. A source region 46 can be formed on one side of each sacrificial gate structure 14 and a drain region 48 can be formed on the other side of each sacrificial gate structure 14. The source region 46 and the drain region 48 can be formed by first removing exposed portions of each vertical stack 20 and the underlying exposed portions of the second spacer 34 that are not protected by each sacrificial gate structure 14 and first spacers 30. The removal of the exposed portions of each vertical stack 20 and the underlying exposed portions of the second spacer 34 that are not protected by each sacrificial gate structure 14 and first spacers 30 can include an etching process. In one example, a reactive ion etch can be employed to remove the exposed portions of each vertical stack 20 and the underlying exposed portions of the second spacer 34 that are not protected.

The remaining portions of each second spacer 34 can be referred to herein as tunnel spacers 30' since each tunnel spacer 30' is located beneath remaining portions of the nanowires 24', 28'. As is shown, the side wall surfaces of each tunnel spacer 30' are located at end portions of each remaining portions of nanowires 24', 28' and the sidewall surfaces of each tunnel spacer 30' are vertically coincident to sidewall surfaces of each remaining portion of nanowires 24', 28'. The nanosheet stack can be designated as 20'.

Next, a semiconductor material can be epitaxial grown from the exposed sidewall surfaces of each remaining portion of nanowires 24', 28'. In one embodiment, the semiconductor material employed as the source region 46 and the drain region 48 can include a same semiconductor material as that of each remaining portion of nanowires 24', 28', yet a different semiconductor material than the non-removed portions of SiGe alloy layers 22', 26'. In another embodiment, the semiconductor material employed as the source region 46 and the drain region 48 can include a different semiconductor material as that of each remaining portion of nanowires 24', 28' so long as the semiconductor material employed in providing the source/drain regions 46, 48 is different from the non-removed portion of SiGe alloy layers 22', 26'.

FIG. 18 is a top-down view of the semiconductor structure in FIG. 19 where the sacrificial gate structure is removed and an inter-layer dielectric (ILD) can be deposited over the source/drain regions, in accordance with an embodiment of the present invention.

The ILD 50 can be formed on opposed ends of the spacers 30.

FIG. 19 is a vertical cross-sectional view through line A-A shown in FIG. 18, in accordance with an embodiment of the present invention.

In an exemplary embodiment, the ILD 50 can have a composition that is selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H).

FIG. 20 is a vertical cross-sectional view through line B-B shown in FIG. 18, in accordance with an embodiment of the present invention.

The ILD 50 is not formed over the nanosheet stacks 20'. However, the removal of the sacrificial gate structure 14 results in a portion 55 of the nanosheet stack being exposed. The remainder of the nanosheet stack is covered by STI 12.

FIG. 21 is a vertical cross-sectional view through line C-C shown in FIG. 18, in accordance with an embodiment of the present invention.

The sacrificial gate structure 14 is removed thus resulting in a gap 52 formed between the spacers 30. A top surface 53 of the second nanowire 28' is now exposed. Additionally, sidewalls 31 of spacers 30 are also exposed. The ILD layer 50 can further be formed over the source/drain regions 46, 48. The ILD can be planarized to be flush with a top surface of the spacers 30.

Prior to removing each sacrificial gate structure 14, the planarized dielectric material 50 has an upper surface that is coplanar with an upper exposed surface of each sacrificial gate structure 14.

In one embodiment, the planarized dielectric material 50 can be formed utilizing a conventional deposition process including, for example, chemical vapor deposition (CVD), plasma enhanced chemical vapor deposition (PECVD), evaporation and spin-on coating.

Figure 22:
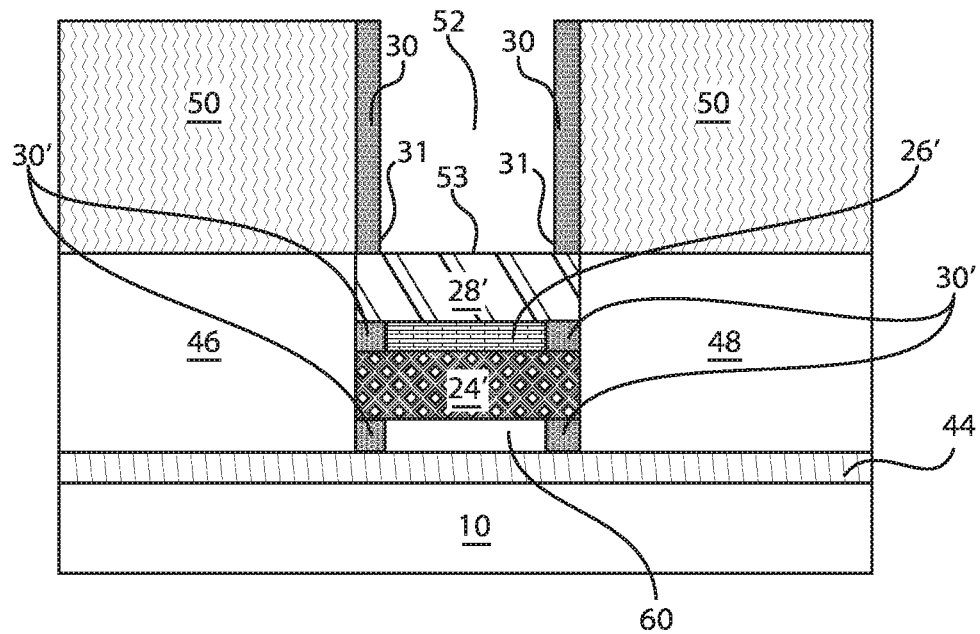
FIG. 22 is a vertical cross-sectional view through line C-C shown in FIG. 18 where a remaining sacrificial section is etched away to form a gap within the nanosheet stack, in accordance with an embodiment of the present invention.

FIG. 22 is a vertical cross-sectional view through line C-C shown in FIG. 18 where a remaining sacrificial section is etched away to form a gap within the nanosheet stack, in accordance with an embodiment of the present invention.

The second remaining SiGe alloy portion 22' is removed by, e.g., etching to form gap 60. In one embodiment, the etch includes an HCl vapor etch. The third remaining SiGe alloy portion 26' remains intact. Also, the remaining nanowires 24', 28' remain intact. The gap 60 is formed between tunnel spacers 30'. The tunnel spacers 30' are located directly beneath the first nanowire 24'. Each nanowire 24' 28' is connected to or directly contacts a source/drain regions 46, 48.

Figure 23:
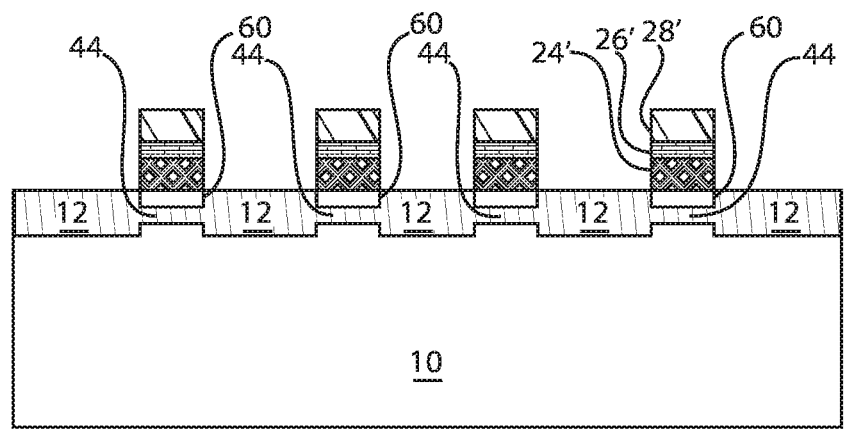
FIG. 23 is a vertical cross-sectional view through line B-B shown in FIG. 18 where the remaining sacrificial section is etched away to form the gap within the nanosheet stack, in accordance with an embodiment of the present invention.

FIG. 23 is a vertical cross-sectional view through line B-B shown in FIG. 18 where the remaining sacrificial section is etched away to form the gap within the nanosheet stack, in accordance with an embodiment of the present invention.

The removal of the remaining second SiGe alloy portion 22' from each multilayered stacked semiconductor material structure 20 suspends each multilayered stacked semiconductor material structure 20 over an upper surface of the STI 12. Thus, the bottommost surface of each of the remaining first nanowires 24' is now exposed (due to the cavities 60 formed).

Figure 24:
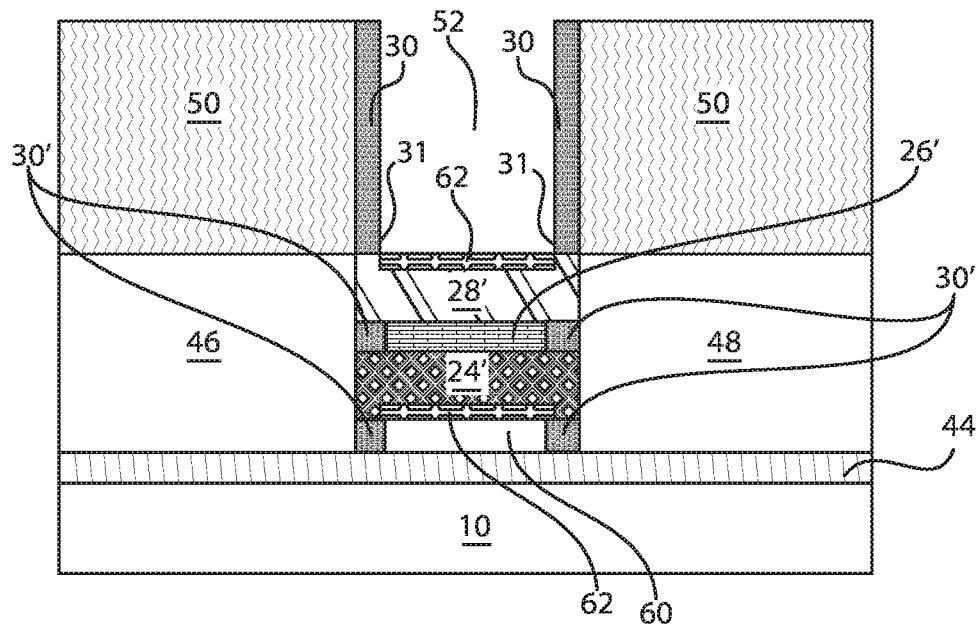
FIG. 24 is a vertical cross-sectional view through line C-C shown in FIG. 18 where oxidation channels are formed onto nanosheet wires of the nanosheet stack, in accordance with an embodiment of the present invention.

FIG. 24 is a vertical cross-sectional view through line C-C shown in FIG. 18 where oxidation channels are formed onto nanosheet wires of the nanosheet stack, in accordance with an embodiment of the present invention.

An oxide channel 62 is formed onto a bottom surface of the first nanowire 24' and an oxide channel 62 is formed onto a top surface of the second nanowire 28'. Since layer 26' remains, the oxidation is only formed on one side of the nanowires 24' and 28'. Specifically, the oxidation is only formed on top of nanowire 28' and not on the bottom of nanowire 28', and it is formed only on the bottom of nanowire 24' and not on the top of nanowire 24'. Since the oxidation layer is only formed on one side, the thickness increment can be controlled two times better than if it was formed on both sides. The oxidation channel 62 is formed by digital etch, which oxidizes the nanowires one monolayer at a time. Therefore, oxidation channels 62 are formed on only one side (either top side or bottom side) on each of the plurality of nanowires 24', 28'.

Figure 25:
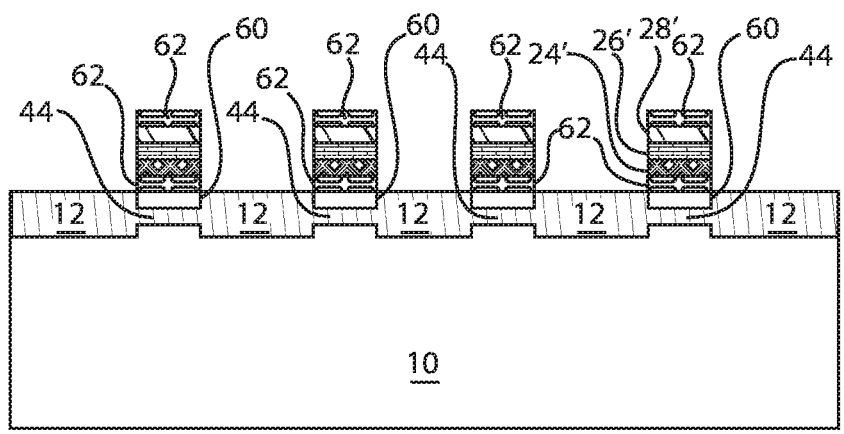
FIG. 25 is a vertical cross-sectional view through line B-B shown in FIG. 18 where the oxidation channels are formed onto the nanosheet wires of the nanosheet stack, in accordance with an embodiment of the present invention.

FIG. 25 is a vertical cross-sectional view through line B-B shown in FIG. 18 where the oxidation channels are formed onto the nanosheet wires of the nanosheet stack, in accordance with an embodiment of the present invention.

The formation of the oxide channels 62 results in each oxide channel 62 of the remaining first nanowire 24' being suspended over an upper surface of the oxide 44 formed in FIG. 15. Thus, the bottommost surface of each of the oxide channels 62 of the remaining first nanowires 24' is now exposed (due to the cavities 60 formed).

Figure 26:
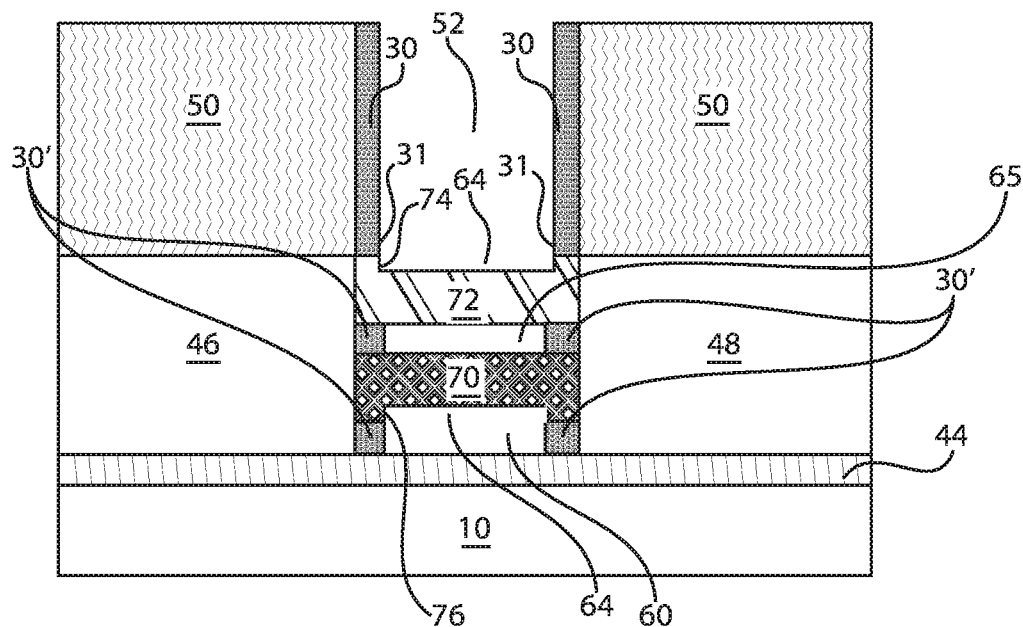
FIG. 26 is a vertical cross-sectional view through line C-C shown in FIG. 18 where the oxidation channels are removed thus causing recesses on the nanosheet wires of the nanosheet stack, in accordance with an embodiment of the present invention.

FIG. 26 is a vertical cross-sectional view through line C-C shown in FIG. 18 where the oxidation channels are removed thus causing recesses on the nanosheet wires of the nanosheet stack, in accordance with an embodiment of the present invention.

The oxide channels 62 are removed by, e.g., etching. Additionally, the third remaining SiGe alloy portion 26' is also removed to form gap 65. The removal of the oxide channels 62 results in a recess 64 formed on a bottom surface of the first nanowire 70 and a recess 64 formed on a top surface of the second nanowire 72. Thus, each nanowire can have an oxidation channel formed thereon, and the removal of all the oxidation channels results in at least one recess being formed on a surface of each of the nanowires. The recesses 64 can create notches or notch regions 74, 76 on one surface of the fins or nanowires 70, 72.

Figure 27:
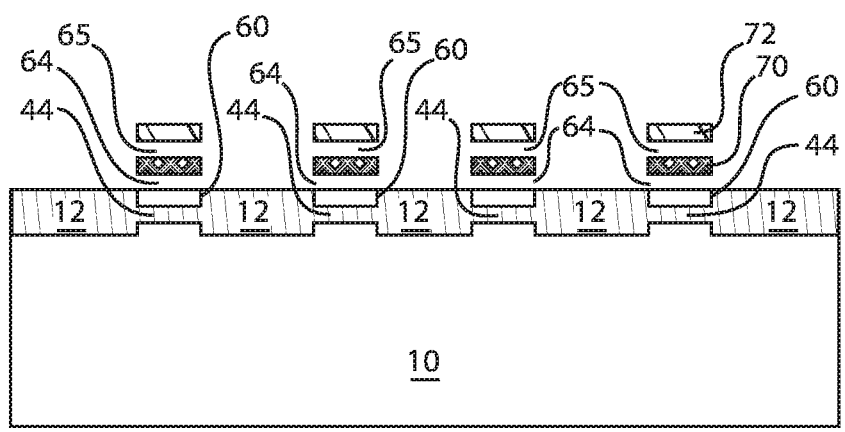
FIG. 27 is a vertical cross-sectional view through line B-B shown in FIG. 18 where the oxidation channels are removed thus causing recesses on the nanosheet wires of the nanosheet stack, in accordance with an embodiment of the present invention.

FIG. 27 is a vertical cross-sectional view through line B-B shown in FIG. 18 where the oxidation channels are removed thus causing recesses on the nanosheet wires of the nanosheet stack, in accordance with an embodiment of the present invention.

The removal of the second and third remaining SiGe alloy portions 22' 26' results in the first and second nanowires 70, 72 being suspended.

Figure 28:
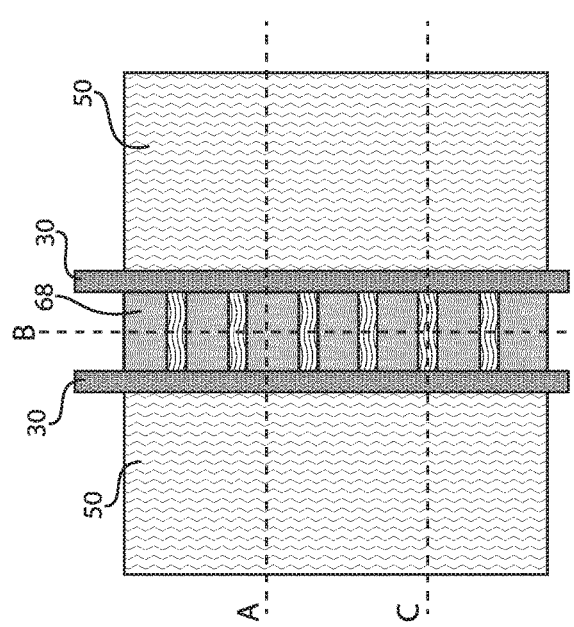
FIG. 28 is a top-down view of the semiconductor structure in FIG. 19 where a high-k metal gate (HKMG) is deposited within the opening formed by removal of the sacrificial gate structure, in accordance with an embodiment of the present invention.

FIG. 28 is a top-down view of the semiconductor structure in FIG. 19 where a high-k metal gate (HKMG) is deposited within the opening formed by removal of the sacrificial gate structure, in accordance with an embodiment of the present invention.

Figure 31:
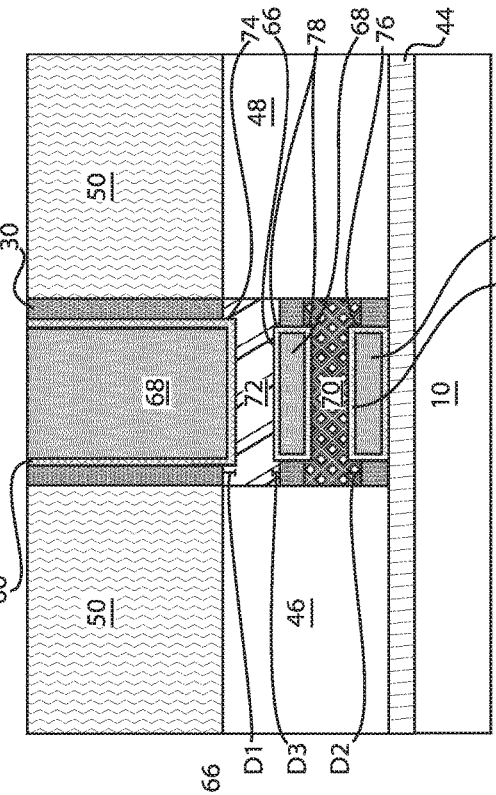
FIG. 31 is a vertical cross-sectional view through line C-C shown in FIG. 28, in accordance with an embodiment of the present invention.
Figure 30:
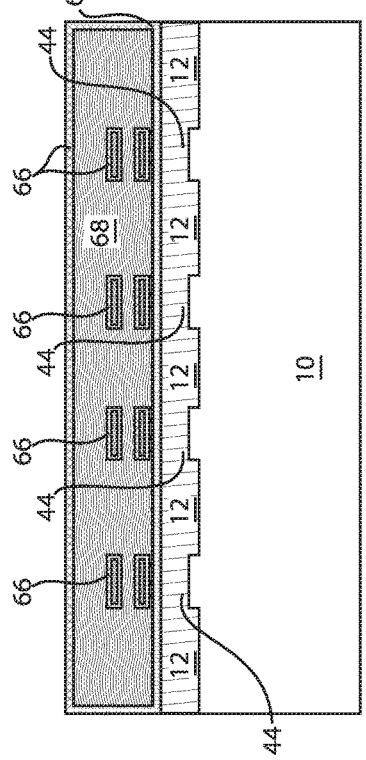
FIG. 30 is a vertical cross-sectional view through line B-B shown in FIG. 28, in accordance with an embodiment of the present invention.

FIG. 29 is a vertical cross-sectional view through line A-A shown in FIG. 28, in accordance with an embodiment of the present invention, whereas FIG. 30 is a vertical cross-sectional view through line B-B shown in FIG. 28, in accordance with an embodiment of the present invention, and whereas FIG. 31 is a vertical cross-sectional view through line C-C shown in FIG. 28, in accordance with an embodiment of the present invention.

With reference to FIGS. 28-31, a high-k metal gate (HKMG) 66, 68 is formed within the recess or gap 52 formed by the removal of the sacrificial gate structure 14. The gate dielectric 66 and the gate conductor 46 are formed within the gate cavity 52 and within each gap 60, 65 (formed by the removal of second and third remaining SiGe alloy portions 22', 26'). The gate dielectric and gate conductor taken together form a first gate structure within the gate cavity 52 and a second gate structure within each gap 60, 65. The HKMG 66, 68 extends into the recesses of the nanowires 70, 72. Stated differently, the notches or notch regions 74, 76, 78 are configured to receive or accommodate the HKMG 66, 68. The notches 74, 76, 78 also have the effect of creating a thinner channel region, as the nanowires 70, 72 are thinner. The notches 74 can extend a distance D1, the notches 76 can extend a distance D2 and the notches 78 can extend a distance D3 into their respective nanowires. The extension or flow of the HKMG 66, 68 into the recesses left behind by the oxidation channels 62 allow for the creation a high threshold voltage (Vt) device.

The gate dielectric 66 is U-shaped having a bottommost portion in direct contact with an upper surface of the topmost semiconductor nanowire 72 and vertical portions that are located on exposed sidewalls of the first spacers 30. Within each gap 60, 65, gate dielectric 66 surrounds gate conductor 68.

The gate dielectric 66 can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from about 0.5 to about 3 and each value of y is independently from about 0 to about 2. In some embodiments, a multilayered gate dielectric structure including different gate dielectric materials, e.g. silicon oxide, and a high k gate dielectric can be formed.

The gate dielectric 66 can be formed by any deposition technique including, for example, chemical vapor deposition (CVD), plasma enhanced chemical vapor deposition (PECVD), physical vapor deposition (PVD), and sputtering, atomic layer deposition. In one embodiment of the present application, the gate dielectric 66 can have a thickness in a range from about 1 nm to about 10 nm. Other thicknesses that are lesser than or greater than the aforementioned thickness range can also be employed for the gate dielectric 66.

The gate conductor 68 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate conductor 68 can be formed utilizing any deposition process described herein.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing one-sided selective oxidation to control channel thickness etching (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fine-tuning a threshold voltage of a nanosheet structure, the method comprising:
    forming a nanosheet stack including a plurality of sacrificial layers and a plurality of nanowires;
    forming a sacrificial gate structure over the nanosheet stack;
    partially etching one or more of the plurality of sacrificial layers to form cavities, the partial etching resulting in remaining sections of sacrificial layers;
    removing the sacrificial gate structure;
    removing at least one of the remaining sections of sacrificial layers to expose a surface of each of the plurality of nanowires;
    forming an oxidation channel directly contacting the exposed surface of each of the plurality of nanowires on only either a top side or a bottom side of each of the plurality of nanowires; and
    removing the oxidation channels to form a recess on each of the plurality of nanowires.

2. The method of claim 1, further comprising forming first spacers adjacent the sacrificial gate structure.

3. The method of claim 2, further comprising filling the cavities with second spacers.

4. The method of claim 3, further comprising forming source/drain regions adjacent the nanosheet stack.

5. The method of claim 4, wherein the removing of the at least one of the remaining sections of sacrificial layers results in gaps formed between the plurality of nanowires.

6. The method of claim 5, further comprising depositing a high-k metal gate (HKMG) extending into the recess of each of the plurality of nanowires and filling the gaps with the HKMG.

7. The method of claim 1, wherein the plurality of sacrificial layers are three or more layers.

8. The method of claim 7, wherein the first layer is a SiGe alloy layer having about 50% atomic concentration of Ge, the second layer is a SiGe alloy layer having about 15% atomic concentration of Ge, and the third layer is a SiGe alloy layer having about 25% atomic concentration of Ge.

9. The method of claim 8, wherein the plurality of nanowires are Si nanowires.

10. The method of claim 9, wherein the one or more of the plurality of sacrificial layers partially etched are the second SiGe alloy layer having about 15% atomic concentration of Ge and the third SiGe alloy layer having about 25% atomic concentration of Ge.

11. A method for fine-tuning a threshold voltage of a nanosheet structure, the method comprising:
    forming a nanosheet stack including a plurality of sacrificial layers and a plurality of nanowires;
    forming first spacers adjacent a sacrificial gate structure formed over the nanosheet stack;
    partially etching one or more of the plurality of sacrificial layers to form cavities, the partial etching resulting in remaining sections of sacrificial layers;
    filling the cavities with second spacers;
    forming source/drain regions adjacent the nanosheet stack;
    removing the sacrificial gate structure;
    removing at least one of the remaining sections of sacrificial layers to form gaps between the plurality of nanowires; and
    forming oxidation channels directly contacting each of the plurality of nanowires on only one side of each of the plurality of nanowires.

12. The method of claim 11, further comprising:
    removing at least another of the remaining sections of sacrificial layers along with the oxidation channels formed on each of the plurality of nanowires;
    depositing a high-k metal gate (HKMG) between the first spacers and within the gaps formed between the plurality of nanowires; and
    extending the HKMG into recesses formed on the plurality of nanowires from the removal of the oxidation channels.

13. The method of claim 11, wherein the plurality of sacrificial layers are three or more layers.

14. The method of claim 13, wherein the first layer is a silicon germanium (SiGe) alloy layer having about 50% atomic concentration of Ge, the second layer is a SiGe alloy layer having about 15% atomic concentration of Ge, and the third layer is a SiGe alloy layer having about 25% atomic concentration of Ge.

15. The method of claim 14, wherein the plurality of nanowires are silicon (Si) nanowires.

16. The method of claim 15, wherein the one or more of the plurality of sacrificial layers partially etched are the second SiGe alloy layer having about 15% atomic concentration of Ge and the third SiGe alloy layer having about 25% atomic concentration of Ge.

* * * * *